United States Patent [19]
Martinson, Jr.

[11] 4,335,404
[45] Jun. 15, 1982

[54] VIDEO SIGNAL MIXER APPARATUS AND METHOD

[76] Inventor: John R. Martinson, Jr., 453 N. Doheny Dr., Apt. C, Beverly Hills, Calif. 90210

[21] Appl. No.: 195,797

[22] Filed: Oct. 10, 1980

[51] Int. Cl.³ .............................................. H04N 5/44
[52] U.S. Cl. .................................... 358/188; 358/183; 358/114
[58] Field of Search .................. 358/188, 183, 83, 93, 358/114

[56] References Cited
U.S. PATENT DOCUMENTS

| | | | |
|---|---|---|---|
| 3,555,430 | 1/1971 | Fischer et al. | 358/188 |
| 4,097,899 | 6/1978 | Yu | 358/188 |
| 4,109,280 | 8/1978 | Dash | 358/188 |
| 4,215,372 | 7/1980 | Suzuki | 358/188 |
| 4,272,791 | 6/1981 | Risken | 360/33 |

Primary Examiner—Richard Murray
Attorney, Agent, or Firm—Lewis Anten

[57] ABSTRACT

A method and apparatus for simultaneously delivering an external source of program material and the program material normally received by a television antenna to the antenna input terminals of a television set.

12 Claims, 2 Drawing Figures

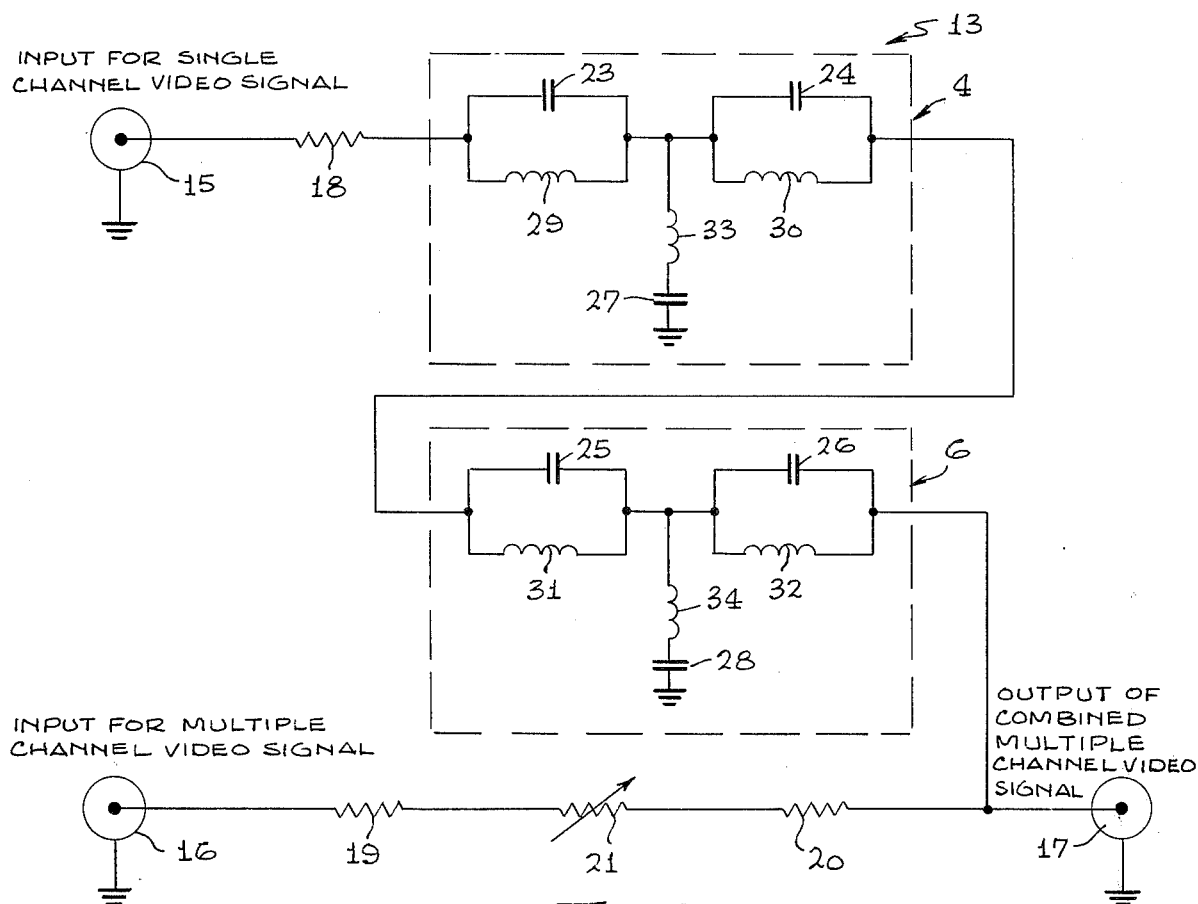
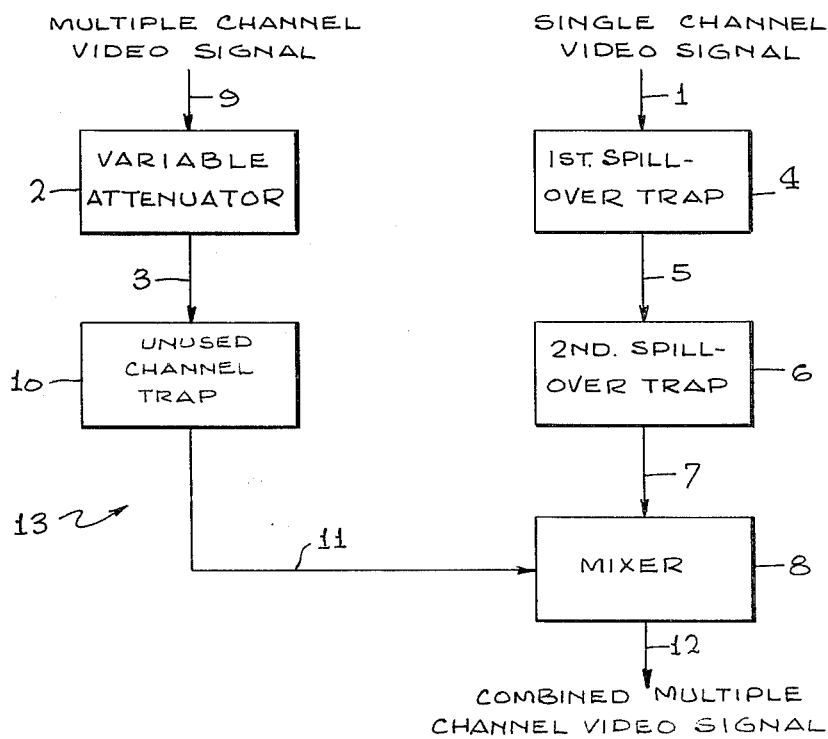

VIDEO SIGNAL MIXER APPARATUS AND METHOD

BACKGROUND OF THE INVENTION

The present invention relates to an apparatus and methods for multiplexing two video signals and, in particular, to an apparatus and method which multiplexes an external source of program material with the program material normally received by a television antenna for the purpose of simultaneously providing these two sources of program material to the antenna input terminal of the television set.

It has recently become very popular to pay private services a fee to provide television program material not otherwise available for viewing on the channels normally received by the television antenna. While certain of these services offer a plurality of channels from which to select a desired television program for viewing, many offer only a single channel of program material, such as subscription television offered under the trademark "ON-TV".

Program material for "ON-TV" is transmitted during portions of the day over UHF channel 52. The signal for this material, however, is transmitted in a scrambled format and therefore cannot be viewed without an unscrambling device known as a "decoder box".

In using the television set, of course, the viewer sets the channel selector to one of the many channels which are available for viewing. The ability to select channels is made possible by the fact that each channel of program material occupies a certain exclusive segment of the radio frequency spectrum band. Thus, changing the channel selector merely alters the segment of the radio frequency spectrum band which the television set is tuned to view. Of course, should a channel be selected which, in fact, is not being used by any local transmitting facility, no intelligible picture or sound will emanate from the television set. Rather, "snow" will appear on the television picture screen accompanied by a hissing sound. A channel which is not utilized by any transmitting facility within the receiving area is hereinafter referred to as an "unused channel".

To enable the "ON-TV" "decoder box" to unscramble the television signal, it must be inserted in the cable which connects the terminal of the television set to the television antenna. Typically, this is accomplished by disconnecting the antenna wire from the television antenna terminal on the television set and connecting it instead to the input of the "decoder box". The output of the "decoder box" is then connected to the antenna terminal of the television set by a separate piece of antenna wire.

In operation, the "decoder box" unscrambles the scrambled television signal being transmitted over UHF channel 52 and then retransmits it on VHF channel 3. Accordingly, to view the unscrambled "ON-TV" signal, the channel selector of the television set must be set to channel 3.

Because of the way the "decoder box" operates, it is not possible to view any other television channel, except "ON-TV" channel 3, while the "decoder box" is switched on. Conversely, it will only be possible to view the channels normally received by the television antenna when the "ON-TV" "decoder box" is switched off. The "ON-TV" channel will not be available. Accordingly, the television's normally used channel selector cannot switch between all available channels of viewing material on its own. Rather, it will also be necessary to switch the "ON-TV" "decoder box" on or off to effectuate viewing of all available television channels.

In addition to the inconvenience of having to operate a second switch to enable viewing of all available television channels, the commonly used remote-control channel selector can no longer be fully used for its intended purpose. This is because the remote-control channel selector of the television set is not generally capable of additionally switching the "ON-TV" "decoder box". Thus, when it is desired to switch from viewing channels received by the normally-used television antenna to the "ON-TV" channel, i.e., channel 3, not only must the channel selector be changed by the remote-control channel selector to channel 3, but it will be additionally necessary to manually switch the "ON-TV" "decoder box" on.

It will also not be possible with an "ON-TV" "decoder box" to utilize a standard video tape recorder to record a channel received by the outdoor television antenna while the "ON-TV" signal is being viewed on the television set, or vice-versa. This is because the output from the "ON-TV" "decoder box" does not simultaneously include both the "ON-TV" programming material and the remaining channels received by the normally used television antenna.

SUMMARY AND OBJECTS OF THE INVENTION

It is a primary object of the present invention to provide an apparatus and method which will permit a remote control channel selector to switch between the channels normally received by the television antenna and a channel occupied by an external source of program material, such as "ON-TV".

Another object of the present invention is to provide an apparatus and method which will permit a standard video recorder to record a channel normally received by a television antenna while an external source of program material, such as "ON-TV", is being viewed on the television set, or vice-versa.

Another object of the present invention is to provide an apparatus and method which can impose a video signal occupying a single channel onto a video signal occupying a plurality of channels without causing interference on the plural channel video signal to channels adjacent to the single channel video signal or significant degradation in the quality of any of the two video signals.

Another object of the present invention is to provide a method and apparatus for mixing two video signals which is inexpensive to manufacture.

Another object of the present invention is to provide a method and apparatus for mixing two video signals which is simple to use.

Another object of the present invention is to provide a method and apparatus for mixing two video signals which needs no external source of power to operate.

Another object of the present invention is to provide a video signal mixer which is small in size.

Another object of the present invention is to provide a video signal mixer which can be constructed from readily available parts.

These, and still further objects of the present invention, are accomplished by providing a video signal mixer for imposing a video signal occupying a single channel onto a video signal occupying a plurality of channels. The video channel mixer has attenuation means for attenuating the signal strength of the multiple channel video signal before it is mixed with the single channel video signal. This minimizes interference to channels on the multiple channel video signal adjacent to the single channel video signal and significant degradation in the picture quality of any of the two video signals. In the preferred embodiment of the present invention, a filter is inserted in the single channel video signal line to minimize any spurious signals present on the next adjacent channel above the single channel video signal which frequently emanates from the source of the single channel video signal.

BRIEF DESCRIPTION OF THE DRAWINGS

FIG. 1 is a schematic diagram of the preferred embodiment of the present invention.

FIG. 2 is a block diagram of the preferred embodiment of the present invention.

DETAILED DESCRIPTION OF THE PREFERRED EMBODIMENT

The schematic diagram of the preferred embodiment of the present invention is shown in FIG. 1. As shown in FIG. 1, video signal mixer 13 includes jacks 15–17, fixed resistors 18–20, potentiometer 21, fixed capacitors 23–28, and inductors 29–34.

Jacks 15–17 are provided to permit rapid insertion and removal of video signal mixer 13 from the television antenna circuit. Any standard 75 ohm coaxial connector can be used for this purpose.

Potentiometer 21 should be a 5,000 ohm one-quarter watt linear variable trim pot. Resistor 18 should be a 200 ohm resistor and resistors 19 and 20 should be a 75 ohm resistor (one-quarter watt). The remaining component values, as now discussed, have been chosen to enable video signal mixer 13 to operate with a single channel video signal input occupying standard television channel 3. Channel 3 has been chosen for the preferred embodiment because, as discussed below, this is the channel on which most types of external video input devices are designed to operate. Other values of components, as readily apparent to those skilled in the art, would be required in order for video signal mixer 13 to operate with a single channel video signal on a different channel.

Based on this selection of channel 3, capacitors 23–26 should be 100 pf ceramic disc capacitors, capacitors 27 and 28 should be 6.8 pf disc ceramic capacitors, inductors 29–32 should be five turns of No. 20 enameled magnetic wire coiled to make a one-eighth inch diameter, one-quarter inch length coil; and inductors 33 and 34 should be 15 turns of No. 20 enameled magnetic wire coiled to make a one-half inch length coil approximately one-quarter inch in diameter.

The operation of video signal mixer 13 is best understood by reference to FIG. 2.

As shown in FIG. 2, the input to video signal mixer 13 is connected by input line 9 to a multiple channel video signal. A typical source for this signal would be the television receiving antenna. The signal from such an antenna would, of course, comprise a plurality of television channels, each occupying an assigned segment of the radio frequency spectrum, with one or more unused channel, i.e., segments of the radio frequency spectrum which have been assigned for television usage but which are not being used and, therefore, are occupied principally by noise.

Connected to input line 1 of video signal mixer 13 is the single channel video signal which is desired to be mixed with the above-described multiple channel video signal. One source for the single channel video signal is the output from a pay television decoder box such as "ON-TV". As described above, "ON-TV" is the designation for a pay television service which transmits a scrambled pay television signal over channel 52 and which uses a decoder box to unscramble this signal and to deliver that unscrambled signal over channel 3. Another source can be the output from a video recorder or video game computer. To avoid interference with any of the signals present on the multiple channel video signal, the single channel video signal should occupy a channel on the multiple channel video signal which is not otherwise used.

Input line 9 is connected to variable attenuator 2. Variable attenuator 2 reduces the magnitude of the signal present on input line 1. The purpose of this signal reduction is to insure that the strength of the channels in the multiple channel video signal adjacent to the single channel video signal are not so great as to cause interference to the single channel video signal after it is mixed with the multiple channel video signal as described below.

Input line 1 is connected to first spill-over trap 4. First spill-over trap 4 minimizes spurious signals present in the single channel video signal in the channel adjacent to and above the single channel video signal. Trap 4 is needed in many instances because of the fact that many single channel video signal sources frequently contain spurious and undesirable signals on their next higher adjacent channel. Without trap 4, these spurious signals would otherwise interfere with the program material present on the next higher adjacent channel in the multiple channel video signal upon which the single channel video signal will subsequently be imposed as described below.

The output from trap 4 is connected by line 5 to second spill-over trap 6. Second spill-over trap 6 provides a similar filtering function as first spill-over trap 4. The reason for the inclusion of second spill-over trap 6 in the preferred embodiment is to insure that all objectionable spurious signals present on the next higher adjacent channel to the single channel video signal are eliminated. The output from second spill-over trap 6 is then connected through line 7 to mixer 8.

Spill-over trap 6 may alternatively be designed to filter out spurious signals present in the channel adjacent to and below the single channel video signal. The schematic for second spill-over trap 6 would be identical to what is shown in FIG. 1 except that the component values would have to be altered in a manner well known to those skilled in the art. This alternative choice for a second spill-over trap 6 is used in instances where the source of single channel video signal programming material may contain spurious signals in the channel adjacent to and below the single channel video signal.

The output from variable attenuator 2 is connected by line 3 to unused channel trap 10. Unused channel trap 10 eliminates any spurious signals which are present in the unused channel of the multiple channel video signal in which the single channel video signal is to be injected. Without unused channel trap 10, noise and other undesirable signals present in the unused channel will be mixed along with the single channel video signal, thereby causing distortions in the single channel video signal. Because of the substantial strength of the signal which normally emanates from an "ON-TV" "decoder box", however, unused channel trap 10 is unnecessary and thus is omitted from the schematic diagram of the preferred embodiment shown in FIG. 1.

The output from unused channel trap 10 is connected by line 11 to mixer 8. If unused channel trap 10 is not included, then output 3 from variable attenuator 2 is connected directly to mixer 8. Mixer 8 superimposes the signal present on line 7 on the signal present on line 11 (or on line 3 if trap 10 is not used). The resulting superimposed signal is a combined multiple channel video signal comprising both the single and multiple channel video signals. The output from mixer 8 is available for usage at output line 12.

To prepare the video channel signal injector shown in FIG. 1 for usage, the inductances of coils 29–34 should be adjusted by deforming the coils as necessary so that the channel 3 single channel video signal can pass through traps 4 and 6 while spurious signals in the channel adjacent to and above the single channel video signal will be surpressed. In the event trap 6 is designed to surpress spurious signals adjacent to and below the single channel video signal, coils 31, 32 and 34 should be adjusted to accomplish this result.

The source of multiple channel video signal information, such as the antenna wire from a VHF television antenna, should then be connected to jack 16, and the VHF television antenna input terminal to the television set should be connected to jack 17. With the television set's channel selector adjusted to receive an occupied television channel, other than channel 3, potentiometer 21 should be adjusted to permit just enough signal to pass so that the viewing picture is clear. If too much signal is allowed to pass, the multiple channel video signal may likely cause interference to the single channel video signal when the single channel video signal is being viewed on the television set. Finally, the source of single channel video signal information, such as the output from an "ON-TV" decoder box, should be connected to jack 15.

Once properly adjusted, the programming material on both the external and regular television channels will simultaneously be presented to the antenna input terminal of the television set without cross-interference. Thus, the television's remote control channel changer can be used to switch between the external and regular channels and a video recorder can be easily programmed to record a regular channel while the external channel is being viewed.

It is, of course, to be understood that the above-described structure is merely illustrative and is in no way limiting of the invention as delineated by the claims appended below.

I claim:

1. A video signal mixer for imposing a single channel video signal onto an unused channel of a multiple channel video signal comprising:
   (a) single channel input means for connection to a single channel video signal;
   (b) multiple channel input means for connection to a multiple channel video signal;
   (c) attenuator means for attenuating the signal strength of the multiple channel video signal, said attenuator means having an input connected to said multiple channel input means and an output; and
   (d) mixer means for mixing the output from said attenuator means with the single channel video signal, said mixer means having a first input connected to said single channel input means, a second input connected to the output of the said attenuator means, and output means for delivering the combined multiple channel signal which is produced.

2. The apparatus of claim 1, wherein said attenuator means includes adjustment means for adjusting the amount of attenuation effectuated by said attenuator means.

3. The apparatus of claim 2, wherein said adjustment means includes a potentiometer.

4. The apparatus of claim 1 further comprising trap means connected between the output of said attenuator means and the second input to said mixer means for reducing the strength of any spurious signals present on the unused channel of the multiple channel video signal before the multiple channel video signal is mixed with the attenuated single channel video signal.

5. The apparatus of claim 1 further comprising spill-over trap means connected between said single channel input means and the first input to said mixer means for reducing the signal strength of any spurious signals present on the next adjacent channel above the single channel video signal before the attenuated single channel video signal is mixed with the multiple channel video signal.

6. The apparatus of claim 5 wherein said spill-over trap means additionally reduces the signal strength of any spurious signals present on the next adjacent channel below the single channel video signal before the attenuated single channel video signal is mixed with the multiple channel video signal.

7. The apparatus of claim 6, wherein said spill-over trap means comprises two separate filters connected in series.

8. The apparatus of claim 5, wherein said spill-over trap means comprises two separate filters connected in series.

9. A video signal mixer for imposing a single channel video signal onto an unused channel of a multiple channel video signal comprising:
   (a) single channel input means for connection to a single channel video signal;
   (b) multiple channel input means for connection to a multiple channel video signal;
   (c) attenuator means for attenuating the signal strength of the multiple channel video signal, said attenuator means having an input connected to said multiple channel input means and an output, said attenuator means further including adjustment means for adjusting the amount of attenuation effectuated by said attenuator means, said adjustment means including a potentiometer;
   (d) mixer means for mixing the output from said attenuator means with the single channel video signal, said mixer means having a first imput connected to said single channel input means, a second input connected to the output of said attenuator means, and output means for delivering the combined multiple channel signal which is produced; and
   (e) spill-over trap means connected between said single channel input means and the first input to said mixer means for reducing the signal strength of any spurious signal present on the next adjacent channel above the single channel video signal before the single channel video signal is mixed with the multiple channel video signal, said spill-over trap means comprising two separate filters connected in series.

10. A method for imposing a single channel video signal onto a unused channel of a multiple channel video signal comprising the steps of:
(a) attennuating the signal strength of the multiple channel video signal; and
(b) mixing the attenuated multiple channel video signal with the single channel video signal.

11. The method of claim 10 further including the steps of reducing the signal strength of any spurious signals present on the next adjacent channel above the single channel video signal before the single channel video signal is mixed with the multiple channel video signal.

12. The method of claim 11 further including the steps of reducing the strength of any spurious signals present on the unused channel of the multiple channel video signal before the multiple channel video signal is mixed with the single channel video signal.

* * * * *